(12) United States Patent
Jensen et al.

(10) Patent No.: US 9,043,007 B2
(45) Date of Patent: May 26, 2015

(54) MATERIAL TEMPLATES FOR AUTOMATIC ASSIGNMENT OF MATERIALS TO A 3D CAD MODEL

(76) Inventors: Claus Wann Jensen, Silkeborg (DK);
Jeffrey McCartney, Irvine, CA (US);
Thomas Teger, Orange, CA (US);
Henrik Wann Jensen, Solana Beach, CA (US)

( * ) Notice: Subject to any disclaimer, the term of this patent is extended or adjusted under 35 U.S.C. 154(b) by 403 days.

(21) Appl. No.: 13/561,741

(22) Filed: Jul. 30, 2012

(65) Prior Publication Data
US 2013/0231768 A1 Sep. 5, 2013

Related U.S. Application Data

(60) Provisional application No. 61/606,314, filed on Mar. 2, 2012.

(51) Int. Cl.
*G06F 19/00* (2011.01)
*G05B 19/18* (2006.01)
(52) U.S. Cl.
CPC ..................................... *G05B 19/18* (2013.01)

(58) Field of Classification Search
USPC .................................. 700/98; 703/8; 345/419
See application file for complete search history.

(56) References Cited

U.S. PATENT DOCUMENTS

| 8,285,407 | B2 * | 10/2012 | Kessel et al. ..................... 700/98 |
| 8,301,419 | B1 * | 10/2012 | Suhr et al. ......................... 703/1 |
| 8,442,804 | B2 * | 5/2013 | Kessel et al. ..................... 703/1 |
| 8,620,627 | B2 * | 12/2013 | Nakhle et al. ..................... 703/1 |
| 2005/0093860 | A1 * | 5/2005 | Yanagisawa et al. ......... 345/419 |
| 2009/0112540 | A1 * | 4/2009 | Kessel et al. ..................... 703/8 |

* cited by examiner

*Primary Examiner* — Robert Fennema
*Assistant Examiner* — Anthony Whittington
(74) *Attorney, Agent, or Firm* — Mandour & Associates, APC

(57) ABSTRACT

The present invention relates to a system, method, and apparatus that include a novel way of automatically assigning materials to 3D CAD models. A predefined material template specifies that a particular part or material name is assigned to a particular material such that all instances of the particular part name are assigned or modified automatically by the material template. By having a consistent naming convention for the parts in the CAD file, this material assignment can be performed automatically when the CAD file is imported or viewed.

12 Claims, 5 Drawing Sheets

| Entry # | CAD Model | Part Name | Initial Material | Assigned Material based on material template | Description |
|---|---|---|---|---|---|
| 1 | Pot | Handle | (null) | Plastic | Coffee pot |
| 2 | Pot | Body | (null) | Glass | Coffee pot |
| 3 | Pot | Pouring opening | Glass | Metal | Coffee pot |
| 4 | Pot | Lid | Glass | Metal | Coffee pot |
| 5 | Mug | Handle | Aluminum | Plastic | Coffee mug |
| 6 | Mug | Body | (null) | Glass | Coffee mug |
| 7 | Mug | Lid | (null) | Metal | Coffee mug |
| 8 | Wheel | Tire | natural rubber | synthetic rubber | Car wheel |
| 9 | Wheel | Rim | Rectangular sheet metal | Titanium metal | Car wheel |
| 10 | Wheel | Bolts | Metal | Titanium metal | Car wheel |
| 11 | Tire | Tire | Rubber | synthetic rubber | Bike tire |
| 12 | Tire | Rim | Metal | Titanium metal | Bike tire |

Fig. 3

MATERIAL TEMPLATES FOR AUTOMATIC ASSIGNMENT OF MATERIALS TO A 3D CAD MODEL

CROSS REFERENCE TO RELATED APPLICATIONS

This application claims priority under 35 U.S.C. §119(e) to U.S. Provisional Application No. 61/606,314, filed Mar. 2, 2012, and entitled "Material templates for automatic assignment of materials to a 3D CAD model," the disclosure of which is hereby incorporated by reference in its entirety.

BACKGROUND OF THE INVENTION

1. Field of Invention

The present invention relates generally to a three-dimensional (3D) model in a computer rendering environment and specifically to a method, apparatus, and system for automatic assignment of materials to a 3D computer aided design (CAD) model.

2. Description of Related Art

Computer rendering is a process used to generate images of 3D models. The goal is often an image of the model that looks like a photograph of the real object in the real world. This particular instance of rendering is called photorealistic rendering. Other instances of rendering include stylistic rendering for illustration purposes.

Computer generated imagery of 3D CAD models include a description of both the materials and lighting of the 3D model. The description of the materials includes how the light reflects in different directions as it strikes a specific part of the 3D CAD model.

CAD is the use of computer technology for computer aided drafting. CAD often involves more than just shapes. As in the manual drafting of technical and engineering drawings, the output of CAD must convey information, such as materials, processes, dimensions, and tolerances, according to application-specific conventions. CAD may be used to design curves and figures in two-dimensional (2D) space; or curves, surfaces, and solids in three-dimensional (3D) space.

CAD is an important industrial art extensively used in many applications, including automotive, shipbuilding, and aerospace industries, industrial and architectural design, prosthetics, and many more. CAD is also widely used to produce computer animation for special effects in movies, advertising, and technical manuals. The modern ubiquity and power of computers means that even perfume bottles and shampoo dispensers are designed using techniques unheard of by engineers of the 1960s. Because of its enormous economic importance, CAD has been a major driving force for research in computational geometry, computer graphics (both hardware and software), and discrete differential geometry.

CAD is mainly used for detailed engineering of 3D models and/or 2D drawings of physical components, but it is also used throughout the design and engineering process from conceptual design and layout of products, through strength and dynamic analysis of assemblies to definition of manufacturing methods of components. It can also be used to design objects.

A problem with the existing assignment of 3D CAD model materials is that a particular 3D CAD model can have tens or even hundreds of parts with different materials. Assigning materials to the particular 3D CAD model is a very time consuming and tedious task.

U.S. Pat. No. 5,140,672 to Suzuki is directed to a diagram generator having reference table which includes reproducing and name assigning units for expanding circuit from lower to higher level. An expansive circuit diagram information generator for use with computer aided design (CAD) systems is used to generate expansive circuit diagrams from a hierarchical circuit diagram. The expansion method makes the expanded circuit diagram more easily readable for its user. The circuit diagram generator consists of the following: an input for the hierarchical circuit diagram composed of high level circuits and low level circuit references; a reproducing unit to insert circuits into the lower level circuit references from a table of standard circuits; a name changing unit to make unique the names between the lower level circuit diagrams which the reproducing unit made identical by referencing two identical circuits from the standards table; and an interface symbol changing unit for replacing links between higher level circuit diagrams and lower level circuit diagrams with jump tags. Although Suzuki's system includes a name changing/assigning unit, Suzuki's name changing unit creates a unique name and does not standardize names such that a template could assign or change the material for each instance of a particular part name.

SUMMARY OF THE INVENTION

Embodiments of the present invention relate to a system, method, and apparatus that include a novel way of automatically assigning materials to 3D CAD models. A predefined material template specifies that a particular part name is assigned to a particular material such that all instances of the particular part name are assigned or modified automatically by the material template. By consistently naming of the parts in the CAD file, this material assignment can be performed automatically by the material templates when the CAD file is imported or viewed. Alternatively, parts can have specific materials assigned in the CAD software. In this case, a particular material name can be assigned to a particular material instead.

In one embodiment, a system comprises: a three dimensional model having one or more parts, wherein the one or more parts have part names or material names; and a material template having template names for assigning materials to the part names or the material names of the parts in the three dimensional model. The material template may use the part names to assign materials to the three dimensional model and the material template may use the material names to assign new materials to the three dimensional model. The material template may use an asterisk in the template names to match any sequence of characters and may use a question mark in the template names to match any single character. The material template may contain a default material in case no match is found and the material template may be matched hierarchically giving highest priority to matches that are closer to leaves of a tree representing the three dimensional model. The material template may specify an ordering of matches that are tried on each part to find a corresponding material assignment. The material template may assign each material when a CAD file is imported or viewed.

In another embodiment, a method comprises the steps of: using a three dimensional model having one or more parts, wherein the one or more parts have part names or material names; and assigning materials to the part names or the material names of the parts in the three dimensional model using a material template having template names.

An advantage of the present invention is that the system changes the material corresponding to each instance of a particular part name faster with more accuracy than conventional methods. A particular 3D CAD model can have hundreds of materials that need to be updated, and assigning and changing each manually is a tedious and time consuming task that can lead to countless errors. It is also possible to apply different material templates to a CAD model to, for example, study the effect of changing in the appearance or color of the object represented by the CAD model.

The actual realization of this invention is more complex than simply replacing material names, as it involves building a hierarchical 3D model from the CAD data and processing that to assign materials to parts that match a description in the material templates. A material template is matched to a particular part name or material hierarchically, giving highest priority to matches that are closer to the leaves of the tree representing the three dimensional model. The leaves of the tree correspond to actual geometry, while the inner nodes correspond to a collection of one or more nodes containing geometry. This means that the material template gives priority to the matches at the geometry level, which allows for a precise control of the assignments to specific geometry even if matches are found higher up in the tree. The material templates can be applied within a realtime ray tracing framework to dynamically test different material configurations on a 3D model and immediately see and evaluate the different appearances. It should be noted that, no one in this industry has presented a rendering system, or for that matter a CAD application, that automatically assigns materials on an imported CAD model, and this would be very useful.

An example of why this is useful includes a particular customer that makes many appliances that are represented in CAD systems. Every year this particular customer makes small adjustments to most of their appliances and they also make small changes in the appearance (color, material, etc.). For this particular customer, it would be a huge time-saver to create a material template that understands their naming scheme for parts in the CAD files representing their appliances. One or more material templates can be created with the updated materials and colors and apply the material templates to each appliance. This saves tremendous time, since even today, this is exactly how this particular customer assign materials (i.e., manually, part by part).

The foregoing, and other features and advantages of the invention, will be apparent from the following, more particular description of the preferred embodiments of the invention, the accompanying drawings, and the claims.

BRIEF DESCRIPTION OF THE DRAWINGS

FIG. 3 illustrates a table for automatic assignment of 3D CAD model materials according to one embodiment of the invention.

DETAILED DESCRIPTION OF THE INVENTION

Before the present composition, methods, and methodologies are described, it is to be understood that this invention is not limited to particular compositions, methods, and experimental conditions described, as such compositions, methods, and conditions may vary. It is also to be understood that the terminology used herein is for purposes of describing particular embodiments only, and is not intended to be limiting, since the scope of the present invention will be limited only in the appended claims.

As used in this specification and the appended claims, the singular forms "a", "an", and "the" include plural references unless the context clearly dictates otherwise. Unless defined otherwise, all technical and scientific terms used herein have the same meaning as commonly understood by one of ordinary skill in the art to which this invention belongs. Any methods and materials similar or equivalent to those described herein can be used in the practice or testing of the invention, as it will be understood that modifications and variations are encompassed within the spirit and scope of the instant disclosure.

The present invention relates to a novel method, system, and apparatus for automatically assigning materials to 3D CAD models based on material templates. 3D CAD models often contain parts that have names that can be used to assign the materials. Parts can also have materials assigned in the CAD system that can be used to assign materials. A material template can be predefined and specify how a part with a given name or material is assigned a specific material. Although the invention is sometimes illustrated and described in the context of 3D rendering, one of ordinary skill in the art can apply these concepts in other dimensions (e.g., 2D, 4D, etc.).

Figure 1:
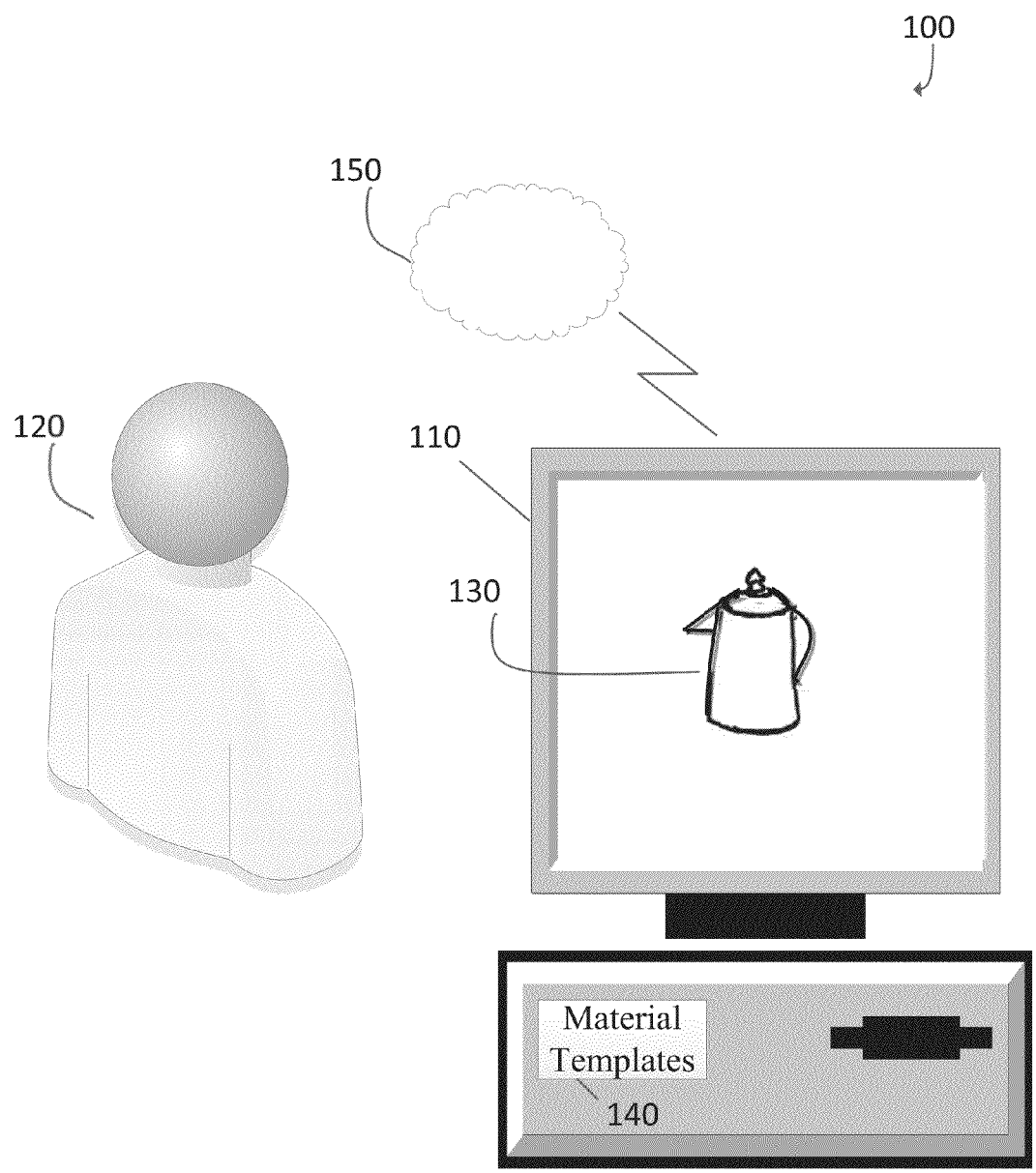
FIG. 1 illustrates a 3D rendering system for automatic assignment of 3D CAD model materials according to one embodiment of the invention.

FIG. 1 illustrates a 3D animation system 100 for automatic assignment of 3D CAD model materials according to one embodiment of the invention. The system 100 includes a terminal 110, a user 120, a CAD model 130, one or more material templates 140, and a network 150. The system 100 automatically assigns and changes materials for a particular part or material name from one material to another material, or from unassigned (e.g., null, undefined, etc.) to an initial material.

The terminal 110 comprises hardware, software, and screen for the user 120. The user 120 can create, edit, watch, listen, or interact with the CAD model 130 on the screen. The hardware comprises a processor, memory, and the material templates 140. The processor can be used to create and edit the CAD model 130 (e.g., 3D CAD model), and the memory can be used to store the 3D CAD model 130.

The CAD model 130 (e.g., 3D model, model, etc.) includes shapes, materials, processes, dimensions, and tolerances, and part names. CAD may be used to design curves and figures in two-dimensional (2D) space; or curves, surfaces, and solids in three-dimensional (3D) space. The CAD model 130 is a 3D representation of a given object as well as other parameters.

The material templates 140 (e.g., templates, predefined templates, etc.) are used to assign a material to each CAD model 130 with a particular part or material name. The CAD models 130 may have an initial material that needs to be changed or the material may be unassigned and the material template assigns an initial material. The material templates can be predefined. The material template specifies how a part with a given name is assigned a specific material.

For example, the 3D CAD model 130 could be a tire, which could initially not have an assigned material. The material template may be set up to assign all materials associated with a tire part name to be rubber. In another example, the 3D CAD model 130 could be a coffee pot having a handle and a body as part names. A particular material template can be predefined to assign all handles to be plastic and all bodies to be glass. As such, the handle material is assigned or changed to be plastic, while the pot's body is assigned or changed to glass. By having a consistent naming convention for all of the parts or materials in the CAD file, this material assignment can be performed automatically when the CAD file is imported or viewed.

The CAD files imported can be any format that includes part names or existing material names. Common file formats include, but are not limited to, OBJ, FBX, IGES, STEP, CATIA, Inventor, Maya, SolidWorks, Pro/ENGINEER, Creo, NX, Rhinoceros, and Solid Edge. The material template 140 can be created either by assigning materials to an existing CAD file and remembering the assignments in a template or the material template 140 can also be created and edited manually by specifying the name of a part in the CAD file and the associated material that should be assigned to all parts with that name. The material templates 140 contain information about the part name and the desired material assignment. This can be as simple as a text string with the part name and a text string of the corresponding material name. The material names are associated with a material library where the physical properties of each material is specified. The difficult part of the material assignment is the extraction of the right names from the plethora of CAD formats that exist. Current methods for assigning materials work by allowing the user to manually change materials one by one.

In another embodiment, the material templates 140 are integrated within a realtime ray tracing application. The ray tracing application continuously renders an image based on the 3D CAD model 130 and the assigned materials. By having a material template 140, the user 120 can both automate the material assignment upon import of the CAD model 130 as well as test different global material assignments to the CAD model 130. For example, to study the different colors and appearances of a given model.

Figure 2:
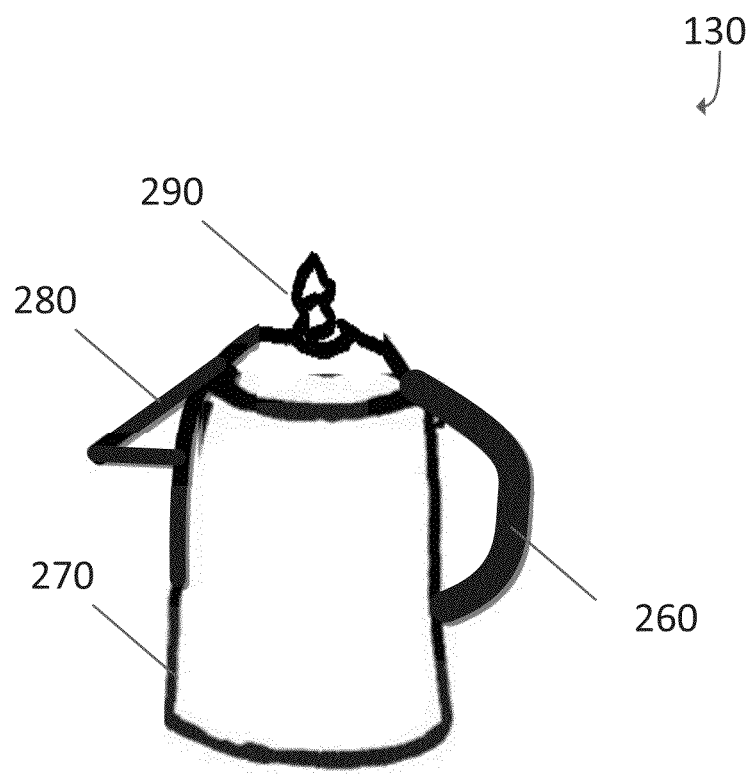
FIG. 2 illustrates a 3D CAD model of the system according to one embodiment of the invention.

FIG. 2 illustrates the 3D CAD model 130 of the system 100 according to one embodiment of the invention. The 3D CAD model 130 includes a handle 260, a body 270, a pouring opening 280, and a lid 290. Each of these four parts (e.g., part names) can be assigned a material by the material templates 140.

The material templates 140 may assign the initial material if the material is unassigned, or change the existing material if assigned, for each instance of a particular part name. The material template 140 specifies one or more part names and corresponding material names. The 3D model 130 imported from any CAD format is processed automatically, so that all parts present in the material template 140 are assigned the material given by the material template 140.

The material templates 140 may use template names for assigning materials to the part names or the material names of the parts in the three dimensional model. The template names are a sequence of letters with optional wildcards that match either a part name or a material assignment in the original CAD data, and the template also specifies the material that will be assigned to a give match.

The part name can be given as a pattern with a form of truncation or wildcards (e.g., seat*, *seat, seat*g, etc.) which may catch different forms and common typos which may exist. Seat*, for example, will match all parts beginning with the part name of seat including the part names of seats and seating. The material template searching for the part name, can use an asterisk in a template name to match any sequence of characters. Alternatively, the material template can use a question mark in the template name to match any single character. If not match is found between the material template name and the part names, the material template can contain a default material for this case where no match is found.

The material template 140 may specify an ordering of matches that are tried on each part to find a corresponding material assignment. For example, the first template that matches a specific part will be given priority over subsequent templates that match the same part. This allows the use of a template '*' that matches all parts for specifying a default material assignment in case no matches are found in the regular templates.

The material templates 140 are adjustable, such that both the part names and materials can be changed within the template. The material templates 140 can be created automatically by assigning materials manually to an existing 3D model. One material template, or more than one (e.g., different) material templates, can be applied to the same 3D model 130 to experience different material assignments. Further, the material templates 140 are portable and can be transferred by the user 120 from the terminal 110 and loaded onto another terminal (e.g., another computer). Further, the material templates 140 can be saved.

FIG. 3 illustrates a table 300 for automatic assignment of 3D CAD model materials according to one embodiment of the invention. The table 300 illustrates CAD models, part names, initial materials, assigned materials based on material templates, and descriptions. For example, the first CAD entry is a handle of a coffee pot. The handle's material is not initially assigned. Then, the material template 140 assigns the material to be plastic. Further, the material template 140 changes all other instances of the handle part name to be plastic as well, including the coffee mug in the fifth entry. By contrast, the fourth entry is the lid of the coffee pot. The lid's material is initially assigned as glass until the one or more material templates 140 change the material to be metal. Again, the material template 140 assigns all other instances of the lid part name to be metal as well, including the coffee mug in the seventh entry. The material template 140 assigns the same part names with the same materials. Alternatively, the material template 140 can change all of the glass materials to be metal materials shown in the third and fourth entries. The assignment or change can occur when the CAD file is imported or when the CAD file is viewed.

Figure 4:
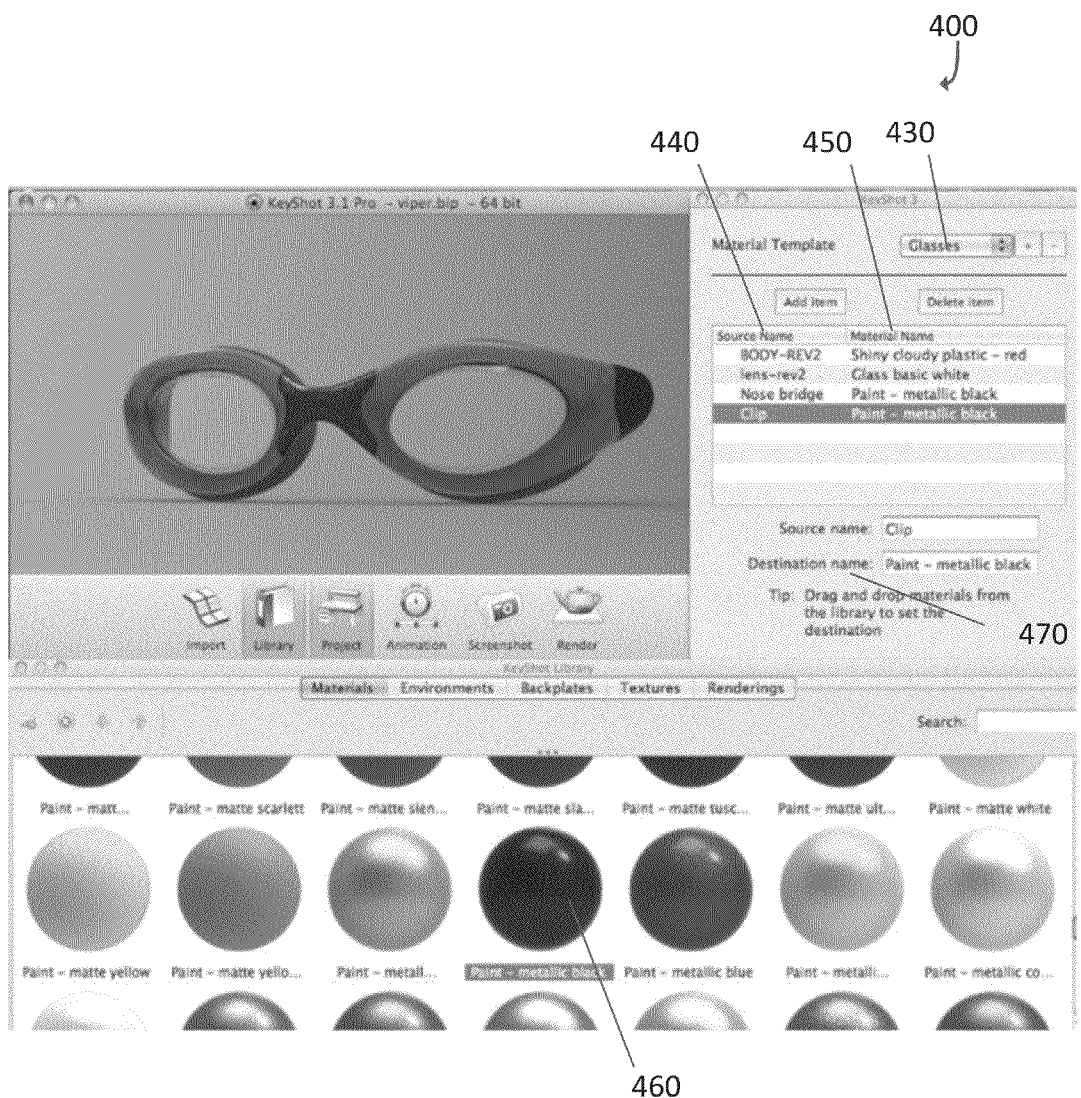
FIG. 4 illustrates a screenshot of an editing application according to one embodiment of the invention.

FIG. 4 illustrates a screenshot of an editing application 400 according to one embodiment of the invention. The editing application 400 includes a 3D CAD model 430, part names 440, material names 450, materials 460, and a destination name 470.

The 3D CAD model 430 is illustrated as being a pair of glasses. The glasses have four parts 440 (e.g., source names): body, lens, nose bridge, and clip. Each part has a corresponding material name 450. For example, the body can have a material name of "shiny cloudy plastic—red" and the clip may initially be unassigned. There are multiple materials 460 for the user 120 to select from for a particular part name in a materials tab. The selected material (e.g., destination name) 470 becomes the new material name for the part name. For example, the new material name 470 for the clip becomes "Paint—metallic black."

Figure 5:
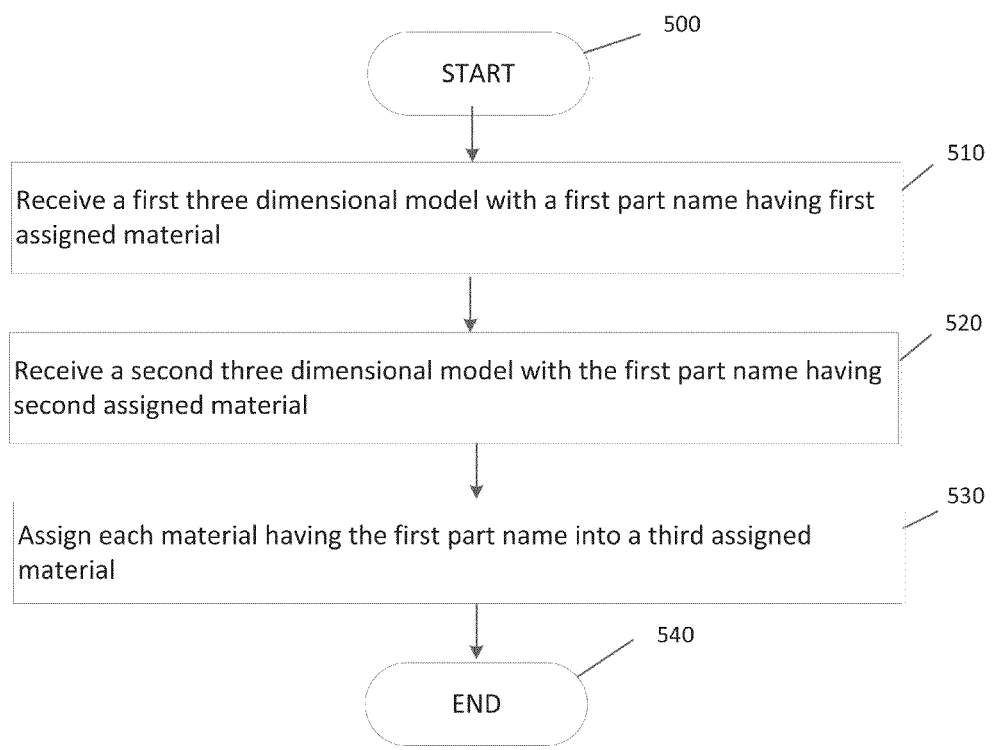
FIG. 5 illustrates a flow chart showing a process for automatic assignment of 3D CAD model materials according to one embodiment of the invention.

FIG. 5 illustrates a flow chart showing a process for automatic assignment of 3D CAD model materials according to one embodiment of the invention. The process starts at step 500. At step 510, the terminal 110 receives a first three dimensional model with a first part name having first assigned material. For example, the 3D CAD model 130 may be a pot, the part name may be a handle, and the material may be unassigned (e.g., null). Next, at step 520, the terminal 110 receives a second three dimensional model with the first part name having second assigned material. For example, the 3D CAD model 130 may be a mug, the part name may be a handle again, and the material may be aluminum. At step 530, the terminal 110 uses the material templates 140 to assign each material having the first part name into a third assigned material. For example, the material template 140 may assign and change the material of the coffee pot and mug handles to be plastic. The process ends at step 540.

The steps of a method or algorithm described in connection with the embodiments disclosed herein may be embodied directly in a computer or electronic storage, in hardware, in a software module executed by a processor, or in a combination thereof. A software module may reside in a computer storage such as in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

It should be understood that the invention is not limited to the embodiments set forth herein for purposes of exemplification, but is to be defined only by a fair reading of the appended claims, including the full range of equivalency to which each element thereof is entitled. Although the invention has been described with reference to the above examples, it will be understood that modifications and variations are encompassed within the spirit and scope of the invention. Accordingly, the invention is limited only by the following claims.

What is claimed is:

1. A system comprising:
  a three dimensional model having one or more parts, wherein the one or more parts have part names or material names; and
  a material template having template names for assigning materials to the part names or the material names of the parts in the three dimensional model, wherein the material template is matched hierarchically giving highest priority to matches that are closer to leafs of a tree representing the three dimensional model.

2. The system of claim 1, wherein the material template uses the part names to assign materials to the three dimensional model.

3. The system of claim 1, wherein the material template uses the material names to assign new materials to the three dimensional model.

4. The system of claim 1, wherein the material template uses a question mark in the template names to match any single character.

5. The system of claim 1, wherein the material template specifies an ordering of matches that are tried on each part to find a corresponding material assignment.

6. The system of claim 1, wherein the material template assigns each material when a CAD file is imported.

7. The system of claim 1, wherein the material template assigns each material when a CAD model is received directly from the CAD application over a network.

8. The system of claim 1, wherein the material template assigns each material when a CAD file is viewed.

9. A method comprising:
  using a three dimensional model having one or more parts, wherein the one or more parts have part names or material names; and
  assigning materials to the part names or the material names of the parts in the three dimensional model using a material template having template names, wherein the material template is matched hierarchically giving highest priority to matches that are closer to leafs of a tree representing the three dimensional model.

10. The method of claim 9, wherein the material template uses the part names to assign materials to the three dimensional model.

11. The method of claim 9, wherein the material template uses the material names to assign new materials to the three dimensional model.

12. The method of claim 9, wherein the material template contains a default material in case no match is found.

* * * * *